United States Patent [19]

Ostergren et al.

[11] Patent Number: 4,639,829
[45] Date of Patent: Jan. 27, 1987

[54] THERMAL CONDUCTION DISC-CHIP COOLING ENHANCEMENT MEANS

[75] Inventors: Carl D. Ostergren, Montgomery, N.Y.; John A. Paivanas, deceased, late of Williamsville, N.Y., by Sophia Paivanas, executor

[73] Assignee: International Business Machines Corporation, Armonk, N.Y.

[21] Appl. No.: 878,399

[22] Filed: Jun. 20, 1986

Related U.S. Application Data

[63] Continuation of Ser. No. 626,554, Jun. 29, 1984, abandoned.

[51] Int. Cl.$^4$ ............................................. H05K 7/20
[52] U.S. Cl. ................... 361/386; 165/80.4; 165/185; 357/79; 357/82; 361/385
[58] Field of Search .................. 165/80.3, 80 B, 80.4, 165/80 C, 185; 174/16 HS; 357/79, 81, 82; 361/382, 383, 385, 386–388

[56] References Cited

U.S. PATENT DOCUMENTS 3,972,012  7/1976  Liu ..................................... 333/84 M
3,993,123  11/1976 Chu et al. ............................. 165/80
4,246,597  1/1981  Cole et al. ............................ 357/81
4,381,032  4/1983  Cutchaw .............................. 165/46

FOREIGN PATENT DOCUMENTS 0141967  5/1980  Netherlands ......................... 165/185

OTHER PUBLICATIONS

"Thermally Enhanced Semiconductor Chip Packaging Structure" by C. P. Coughlin et al., IBM Technical Disclosure Bulletin, vol. 21, No. 1, Jun. 1978, p. 185.
"Silicon Heat Sink Method to Control Integrated Circuit Chip Operating Temperatures" by W. E. Ahearn et al., IBM Tech. Discl. Bulletin, vol. 21, No. 8, Jan. 1979, pp. 3378–3380.
"Thermal Conduction Module: A High-Performance Multilayer Ceramic Package" by A. J. Blodgett et al., IBM J. Res. Develop. vol. 26, No. 1, Jan. 1982, pp. 30–36.
"Conduction Cooling for an LSI Package: A One-Dimensional Approach" by R. C. Chu et al., IBM J. Res. Develop. vol. 26, No. 1, Jan. 1982, pp. 45–54.
"Chip Cooling" by P. W. Ing, ITM Technical Disclosure Bulletin, vol. 13, No. 5, Oct. 1970, p. 1060.
J. K. Hassan et al., "High Performance Chip-Cooling Technique" IBM Technical Disclosure Bulletin, vol. 26, No. 7A, 12/83, pp. 3235–3236.
Dombrowskas et al., "Conduction Cooled Chip Module", IBM Technical Disclosure Bulletin, vol. 14, No. 9, 2/72, p. 2689.
J. K. Hassan et al., "Chip Heat Transfer Structure", IBM Technical Disclosure Bulletin, vol. 25, No. 1, 6/82, pp. 315–318.

Primary Examiner—A. D. Pellinen
Assistant Examiner—Gregory N. Thompson
Attorney, Agent, or Firm—T. Rao Coca

[57] ABSTRACT

A device to thermally couple a heat dissipating integrated circuit chip to the heat sink in a thermal conduction module for effective cooling of the chip by minimizing the thermal resistance path from the chip to the sink. The device is a combination of a heat conducting flat based, truncated solid conical disc which is spring loaded on the back of the chip and a heat conductive hat member having an opening with a continuous tapered wall to conformally fit over the truncated conical disc. The gap between the disc and the hat is packed with a thin layer of a high thermal conductivity grease to provide a low interfacial thermal resistance and mechanical flexibility between the disc and the hat. For additional cooling enhancement of the chip, at the interface between the chip back surface and the base of the disc a self-healing alloy having a high thermal conductivity and low melting point is provided.

15 Claims, 7 Drawing Figures

THERMAL CONDUCTION DISC-CHIP COOLING ENHANCEMENT MEANS

This application is a continuation of copending application Ser. No. 626,554, filed on June 29, 1984.

FIELD OF THE INVENTION

This invention relates to conduction cooling of small heat generating electronic devices such as integrated circuit (IC) chips, and more particularly, to a cooling device having an extremely low thermal resistance path between the IC chip and the heat sink.

As used herein, thermal resistance R is defined as $R = \Delta T/Q$, where $\Delta T$ is the temperature difference and Q is the heat flow between two sections in space. This relationship is a consequence of Fourier's conduction equation $Q = kA (\Delta T/L)$, where A is the cross-sectional area normal to the heat flow, L is the distance through which the heat flows, and k is the thermal conductivity of the medium.

DESCRIPTION OF THE PRIOR ART

The introduction of large scale integration (LSI) and very large scale integration (VLSI) at the chip level and large scale integration at the module level by packaging multiple chips on a single multilayer ceramic (MLC) substrate has significantly increased the number of circuits per unit volume, and at the same time increased their heat flux density. For example, integration at the chip and module levels has resulted in circuit densities as high as $2.5 \times 10^7$ circuits per cubic meter with the necessity of removing heat flux densities on the order of 1000 kW/m$^2$ at the chip level. To remove these high heat flux densities various means of dissipating the heat have been investigated. Of these the gas encapsulated conduction-cooling technique as embodied in the thermal conduction module (TCM) and disclosed in U.S. Pat. No. 3,993,123, issued to Chu et al and assigned to IBM Corporation, the present assignee, and in the articles entitled "Thermal Conduction Module: A High Performance Multilayer Ceramic Package", by A. J. Blodgett and D. R. Barbour and "Conduction Cooling for an LSI Package: A One Dimensional Approach" by R. C. Chu, U. P. Hwang and R. E. Simons and published in IBM Journal of Research and Development, Vol. 16, No. 1, January 1982, at pages 30–36 and 45–54, respectively, has proven to be the most advantageous technique hitherto.

The components of this prior art TCM assembly are shown schematically in FIG. 1 wherein 10 designates a MLC substrate. In one example the substrate 10 is 90×90 mm in area, contains up to 33 layers and is capable of providing power dissipation and wiring for, typically, up to 100 logic chips 11 or a combination of 118 logic or array chips. The substrate 10 has typically about 1800 I/O pins 12 brazed on the bottom surface thereof for purposes of connecting to the next level package. A cylindrical piston 13, one for each chip 11 on the substrate 10, is biased by means of a spring 14 so as to contact the back of each chip, provides the main heat conductive path to a water cooled housing consisting of a cover or hat 15 and a cold plate 16, the latter having suitable chambers for circulation of water. A metal C-ring 17 coated with wax and compressed between the hat 15 and the substrate frame 18 forms a reworkable hermetic seal. Helium gas at a pressure of about 1.6 atm. is provided in the interface gaps of the sealed module to serve as a heat-conducting medium and enhance conduction of heat from the chip to the hat. The face of the piston 13 that directly contacts the chip 11 is machined to a 150-mm spherical radius to minimize off-center contact due to chip tilt and thereby provide uniform chip temperatures and reduced mechanical stress on the chip.

For convenience in analyzing the thermal performance of the TCM, reference is made to FIG. 2 which illustrates in a cross-sectional representation a single-chip unit of the TCM and the thermal resistance of the heat path from the chip 11 to the cold plate 16 divided into various segments. $R_{ext}$ designates the external thermal resistance and is defined relative to the module as $$R_{ext} = \frac{\Delta T_{h-iw}}{P_m}$$

where $\Delta T_{h-iw}$ is the temperature difference between the hat 15 and the inlet water and $P_m$ is the module power. $R_{ext}$ is divided into two parts: the interfacial resistance between the hat 15 and the mating surfaces of the cold-plate 16 and the resistance between the cold-plate surface and the circulating water inside the cold plate. $R_{int}$ designates the internal thermal resistance of the TCM and is defined as $$R_{int} = \frac{\Delta T_{c-h}}{P_c}$$

where $\Delta T_{c-h}$ is the temperature difference between the chip 11 and the top of the hat 15 and $P_c$ is the chip power. $R_{int}$ is composed of five component resistances. $R_c$, $R_{c-p}$, $R_t$, $R_{p-h}$ and $R_h$. $R_c$ designates the chip internal resistance, $R_{c-p}$ is the thermal resistance in the interface between the chip 11 and the piston 13, $R_t$ is the thermal resistance of the piston 13, $R_{p-h}$ is the thermal resistance between the piston 13 and the hat 15 and $R_h$ designates the thermal resistance of the hat 15.

The thermal resistance in the interface between the chip 11 and the piston 13, $R_{c-p}$, is a complex function of many geometric, physical and thermal characteristics of the contacting solids and the interfacial helium gas medium. $R_{c-p}$ is composed of three parallel thermal resistances: a conduction resistance through many small metallic contact areas, thermal radiation resistance through the gap, and thermal conduction resistance through the interfacial helium gas medium. The last of these three resistances being the lowest, the most dominant thermal conduction path is the thermal conduction across the interfacial helium gas.

The thermal resistance $R_{p-h}$ between the piston 13 and the hat 15 is a function of several parameters including the radius and length of the piston 13, the annular gap between the piston 13 and the hat 15, the cross-sectional areas of the hat 15, the temperatures and thermal conductivities of the piston and hat.

As disclosed in the aforementioned Chu et al article, typical values of the various thermal resistances discussed above are as follows: $R_c = 0.43°$ C/W, $R_{c-p} = 2.9°$ C/W, $R_t = 1.02°$ C/W, $R_{p-h} = 2.15°$ C/W and $R_h = 1.58°$ C/W adding up to a module total internal resistance $R_{int}$ of 8.08° C/W. $R_{ext}$ is typically about 0.15° C/W.

Despite these impressively low thermal resistances, the prior art TCM has inherent limitations, due to the particular shapes and sizes of the heat conducting elements, e.g., the piston and the hat assembly, in its ability to transfer heat from the IC chip to the cold plate so as to maintain the chip temperature in the required range between 40° C. and 85° C. particularly in the case of presently contemplated VLSI chips having a power dissipation of 50 watts or higher. Another disadvantage of the above prior art TCM is the critical requirement imposed by the thermal design thereof of using helium gas in the interface between the chip and the piston, and in the annulus between the piston and the hat at a sufficient level. Although helium possesses excellent thermal properties for a gas and is inert, nontoxic, and nonflammable, it is extremely difficult to contain in a sealed enclosure. In addition, under molecular flow conditions, air will enter the enclosure at the same time helium is leaking out, thereby rendering the high product performance of the TCM dependent upon its time-dependent sealing characteristics.

It is an object of the invention to provide a TCM having considerable extendability for future applications, particularly in terms of its cooling ability.

It is another object of the invention to provide a TCM for cooling high power dissipating IC chips without utilizing helium gas environment in the interface gaps therein.

It is yet another object of the invention to provide a TCM having an extremely low thermal resistance path from the IC chip to the outer hat surface region.

It is still another object of the invention to provide a TCM in which the chip to conductive surface contact interface is maintained at a low thermal resistance regardless of the chip tilt.

It is another object of the invention to provide a simple inexpensive structure between the IC chip and the hat which not only insures the most advantageous contact with the chip and hat surfaces, but also is mechanically flexible.

SUMMARY OF THE INVENTION

The above objects and other related objects and advantages may be achieved through the use of novel thermal conduction disc and hat combination herein disclosed. In one illustrated preferred embodiment of the invention the thermal conduction disc is a heat conductive flat based, truncated solid conical piece which is spring loaded on the IC chip to be cooled by contacting the flat base with the back of the chip. The hat also is heat-conductive, the bottom portion thereof being provided with a tapered opening for conformally receiving the thermal conduction disc. The gap between the tapered surfaces of the hat and the disc which embrace each other is filled with a conductive thermal grease for providing not only a low interfacial thermal resistance between the disc and the hat, but also serving as an effective damping medium against impact loads on the chip. A heat sink thermally coupled to the hat removes the heat transferred to the hat by the IC chip via the disc.

For additional enhancement of chip cooling, a thin conformal layer of a self-healing, highly thermal conductive and low melting point alloy, which upon melting provides a low interfacial thermal resistance, is provided between the chip and the base of the disc.

BRIEF DESCRIPTION OF THE DRAWINGS

The novel features and elements characteristic of the invention are set forth in the appended claims. The invention itself, however, will be best understood by reference to the detailed description which follows in conjunction with the accompanying drawings, wherein:

DETAILED DESCRIPTION OF PREFERRED EMBODIMENT

Figure 3:
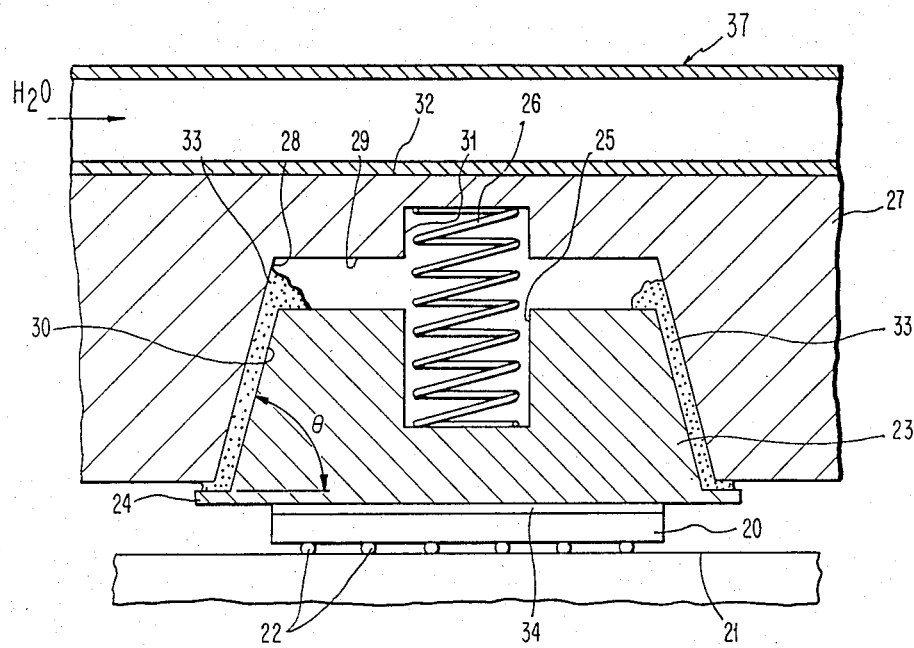
FIG. 3 is a fragmentary portion in cross-sectional representation of an embodiment of a thermal conduction module incorporated therein a thermal conduction disc in accordance with the present invention showing the novel features.

The specific essential elements of a thermal conduction module in accordance with the present invention are illustrated in FIG. 3. In FIG. 3 the IC chip that is desired to be maintained in a specific temperature range by rapidly dissipating away heat therefrom is designated by numeral 20. Chip 20 is mounted on a multilayer ceramic substrate 21 via solder ball connections 22 in a face-down orientation. That is, the chip surface containing the integrated circuits is mounted face-down to the substrate 21. A heat conductive disc 23 (also referred to herein as thermal conduction disc) shaped in the form of a truncated solid cone and having a flat base is mounted on the chip 20 such that the flat base contacts the back surface of chip 20. The back surface of the IC chip 20 is typically flat within about 1 microinch. The base of disc 23 is also machined to an extraordinarily high degree of flatness matching that of the chip thereby minimizing, upon assembly, any gap between the two contacting surfaces under consideration. The smaller the gap between the chip surface and the base of the disc 23, the smaller the thermal resistance therebetween. The surface area of the base 23 is tailored to be generally larger than the surface area of the chip 20 to permit the base of disc 23 to maintain continuous contact with chip 20 even when the latter tilts due to imperfect solder ball mountings 22.

The base portion of the disc 23 is provided with a lip 24 which extends beyond the slanted wall of the disc 23.

Located in the top portion of the disc 23 is a spring retainer opening 25 to accommodate therein a compression spring 26. The spring 26 provides a force to the thermal conduction disc 23 which presses against the chip 20 making a good heat conductive contact therewith.

Overlying the conical truncated disc 23 in a conformal or mating relationship therewith is a heat conductive hat member 27 having an opening with a continuous tapered sidewall 28 and essentially flat ceiling 29. The angle of taper of the sidewall 28 closely matches the tapering angle $\theta$ corresponding to the tapered surface 30 of the disc 23 indicated in FIG. 3. The ceiling 29 contains a circular slot 31 to retain the upper portion of the compression spring 26. The hat member 27 has an upper surface 32 for attaching to a heat sink 37 in the form of a water cooled cold plate. Alternatively, the hat 27 may be provided with large fins extending therefrom over which cold air is blown to dissipate heat from the hat.

In the gap between the tapered surfaces 28 and 30 of the hat 27 and the disc 23, respectively, which has a finite dimension t is provided a highly thermal conductive grease 33 having a low thermal resistance in the range of 1°–1.2° C./watt per mil of thickness (for a chip area of 4.5×4.5 mm$^2$) and a rheology such that it will fill the narrow gap to form a dense pack and ensure good thermal contact between the disc 23 and the hat 27.

Figure 4:
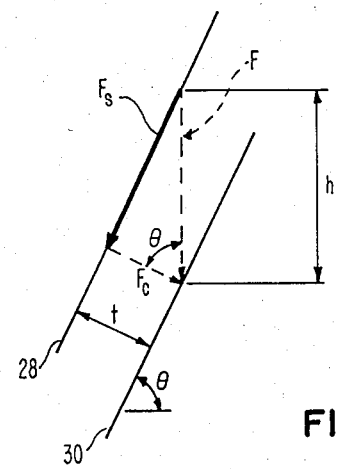
FIG. 4 is a geometrical construction of a fragment of the tapered surfaces of the thermal conduction disc and the overlying hat of the thermal conduction module of the present invention illustrating the geometrical relationship between the thickness of the grease interface between these surfaces, the vertical travel of the hat with respect to the disc and the degree of taper of the tapered surfaces.

There are several benefits that enure from the conformal tapered surfaces 28 and 30 of the hat 27 and disc 23 assembly shown in FIG. 3. First, the surface area of contact between the disc 23 and hat 27 is maximized. Typically, the tapered surface area of contact is about 5–10 times the area of the chip 20. Such a maximized area of contact between the disc 23 and hat 27 maximizes the removal of heat flux from the disc to the hat. Another advantageous aspect of the tapered arrangement is that it provides the most favorable chip loading and mechanical flexibility conditions. To elaborate on this, referring to FIGS. 3 and 4, the vertical travel of the hat 27 with respect to the disc 23 designated by the letter h is related to the thickness t of the grease in the gap between surfaces 28 and 30 by the trigonometric equation h=t Sec $\theta$. Since the taper angle $\theta$ is large, typically close to 90°, the disc 23 can move within the hat 27 a large vertical distance h for small variations in the grease thickness t thereby providing mechanical flexibility. Regarding the favorable chip loading aspect, referring again to FIGS. 3 and 4, when the hat 27 provides a normally directed load F (which is the compression force in the spring 26) this load is applied on the disc 23 as two components: a compression force $F_c$ which is related to F by $F_c = F \cos \theta$ and a shear force $F_s$ which is given by $F_s = F \sin \theta$. Since the taper angle $\theta$ is typically close to 90°, the load F is conveyed to the disc 23 predominantly as the shear force $F_s$, nevertheless a finite compression force $F_c$ is applied on the disc thereby assuring a good thermal contact between the disc 23 and hat 27.

The preferred range of the taper angle $\theta$ is 85°<$\theta$<90°. When $\theta$ is less than 85°, the compression force $F_c$ will be rather too high requiring a rather thick grease layer between surfaces 28 and 30. Such a thick layer of grease will render the thermal path between hat 27 and disc 23 ineffective. When $\theta$=90°, all the force applied by the hat 27 on the disc 23 will be shear force without any compressive force thereby rendering the thermal contact between the two mating elements 23 and 27 rather poor.

Figure 5:
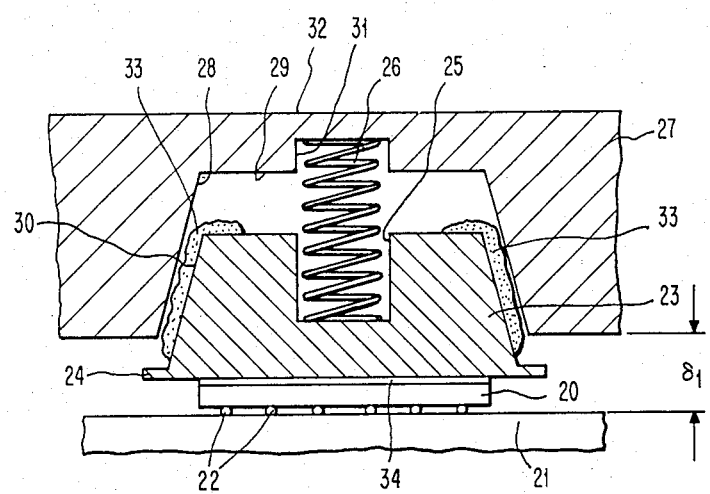
FIG. 5 and 6 are schematic cross-sectional views of the portion of the module of FIG. 3 at different stages of assembly of the module.
Figure 6:
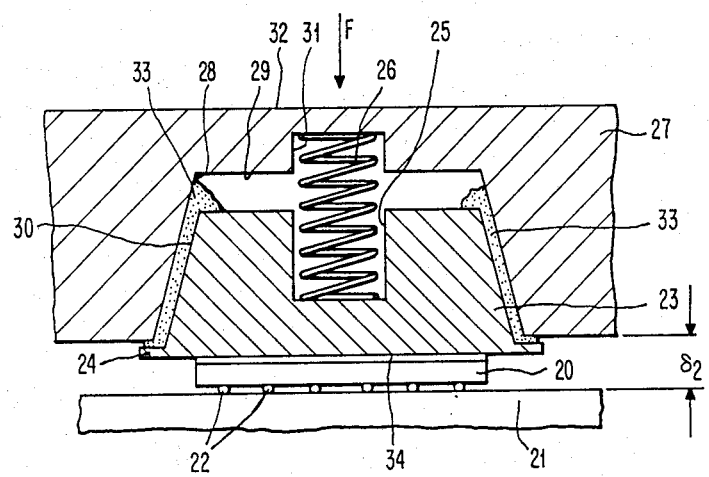

The basic assembly features of the thermal conduction disc 23 and the conformal hat 27 are illustrated in FIGS. 5 and 6 which show the initial and final assembly features, respectively. In the initial condition, represented by a large separation $\delta_1$ between the substrate 21 and the hat 27 and a large and nonuniform grease 33 thickness, the disc 23 is free to swivel and seat fully on the chip 20. Upon assembly, which is represented by a smaller separation $\delta_2$ between the substrate 21 and the hat 27, at a given contact load F the grease 33 thickness is reduced by the mutually opposite shear forces applied by surfaces 28 and 30 on the grease 33 therebetween while maintaining the initial seating condition. The grease flow resulting during the assembly can be controlled to move into the hat region, i.e. in the region between the ceiling 29 of hat 27 and the top truncated surface of the disc 23, rather than down into the chip region by taking advantage of the higher extrusion resistance offered by the tapered hat surface 28 as the disc 23 pushes into the hat 27. Further, any grease that flows downward during the assembly conveniently remains on the protruding lip 24 at the base of the disc 23 rather than reach the chip region. Typically, about 100–150 grams contact load, applied via the spring 26 compression, is sufficient to provide the necessary thermal contact.

Typical materials that can be used to fabricate the disc 23 and the overlying hat 27 include aluminum, copper, silver and silicon carbide. Due to its large mass density and high thermal conductivity, copper is particularly suitable for forming the disc 23.

The dimensions of the thermal conduction disc 23 are determined by the size and power dissipation of the chip to be cooled. For example, in order to efficiently dissipate heat from a 30 watt chip of chip size 4.5×4.5 mm$^2$, a copper disc 23 of height about 0.75 cm and mean diameter of the conical portion of the disc of about 0.65 cm, resulting in a surface area of the conical portion of 1.5 cm$^2$ is essential.

By utilizing the thermal conduction disc 23 and hat 27 combination having a thermal grease interface therebetween shown in FIGS. 3, 5 and 6, the thermal resistance between the chip and the top of the hat, $R_{int}$, can be decreased by a factor of approximately three compared to the prior art gas encapsulated construction utilizing a cylindrical piston having a curved bottom and a hat having a straight-walled opening to enclose the piston.

Further enhancement of the heat transfer from the chip to the heat sink can be achieved by the invention by further reducing the thermal resistance between the chip 29 and the disc 23 by providing a conformal interface layer of a self-healing alloy material 34 having a high thermal conductivity and low melting point, as illustrated in FIGS. 3, 5 and 6, between the back surface of chip 20 and the base of disc 23. The alloy material has a low solidus temperature in the range 85°–90° C. and a low liquidus temperature in the range 110°–115° C. and provides a self-healing interface between the chip 20 and disc 23 upon disruption of this interface. An example of a suitable alloy material 34 is the commercially available Ostalloy produced by Acronium, Inc., Providence, R.I., which consists of bismuth (46.7%), lead (39.3%), tin (12.4%) and indium (16%). Ostalloy has a solidus temperature of 88° C. and a liquidus temperature of 110° C. A 25 micron (1 mil) thick coating of Ostalloy that is metallurgically bonded to a copper disc has a thermal resistance of less than 0.1° C./W. The Ostalloy may be applied to the base of disc 23 by simple soldering or by arc-spraying.

The interface alloy layer 34 enhances the cooling ability of the disclosed structure by eliminating any voids that may exist between the two contacting chip 20 and disc 23 surfaces which introduce high thermal resistance paths therebetween due to the disruption created by the void. The presence of the alloy layer 34 prevents this since if the interface is disrupted there will be an increase in its thermal resistance and a rise in chip temperature. If the rise in chip temperature is great enough to raise the alloy 34 temperature above its solidus temperature, the alloy will reflow and establish a conformal interface and the chip temperature will return to the normal range.

Thermal experiments conducted on a model of the device shown in FIGS. 3-6, utilizing the Ostalloy interface between the chip 20 and thermal conduction disc 23 and a thermal grease interface between the disc 23 and the hat 27 demonstrated that by using the subject device the thermal resistance $R_{int}$ can be reduced by a factor 6 compared to the prior art gas encapsulated device.

In summary, the truncated solid conical disc and the tapered hat fitting conformally over the disc with the gap therebetween being densely packed with a thin layer of a high thermal conductive grease provides a simple, efficient and excellent thermal conduction means to transfer heat from a high wattage IC chip to a cold sink. This excellence in heat transfer is due to the enormously large surface area of contact between the disc and the hat stemming from the unique shapes of these elements. The efficiency in heat transfer is due to the provision of the grease interface between these large surfaces. Further improvement in heat transfer arises from the unique low melting point and high thermal conductivity alloy interface provided between the IC chip and the base of the disc.

Figure 1:
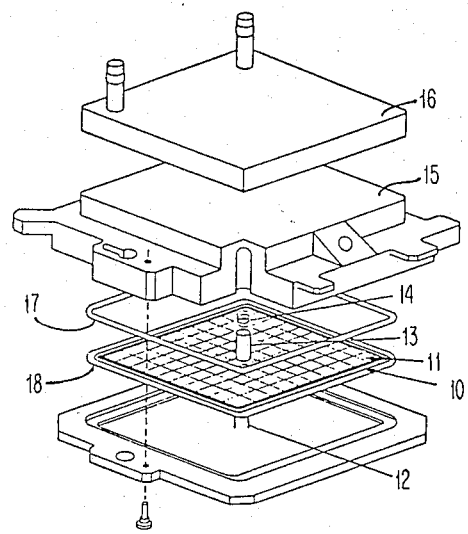
FIG. 1 is an expanded perspective view of a conventional thermal conduction module.
Figure 2:
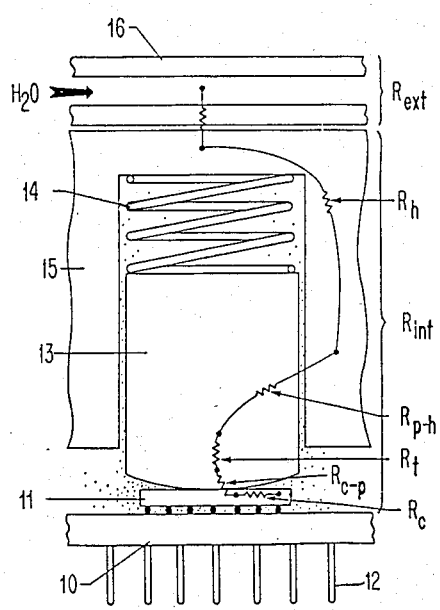
FIG. 2 is a fragmentary illustration in a cross-sectional representation of a part of the conventional thermal conduction module showing the various thermal resistances in the thermal path between the IC chip and the heat sink.
Figure 7:
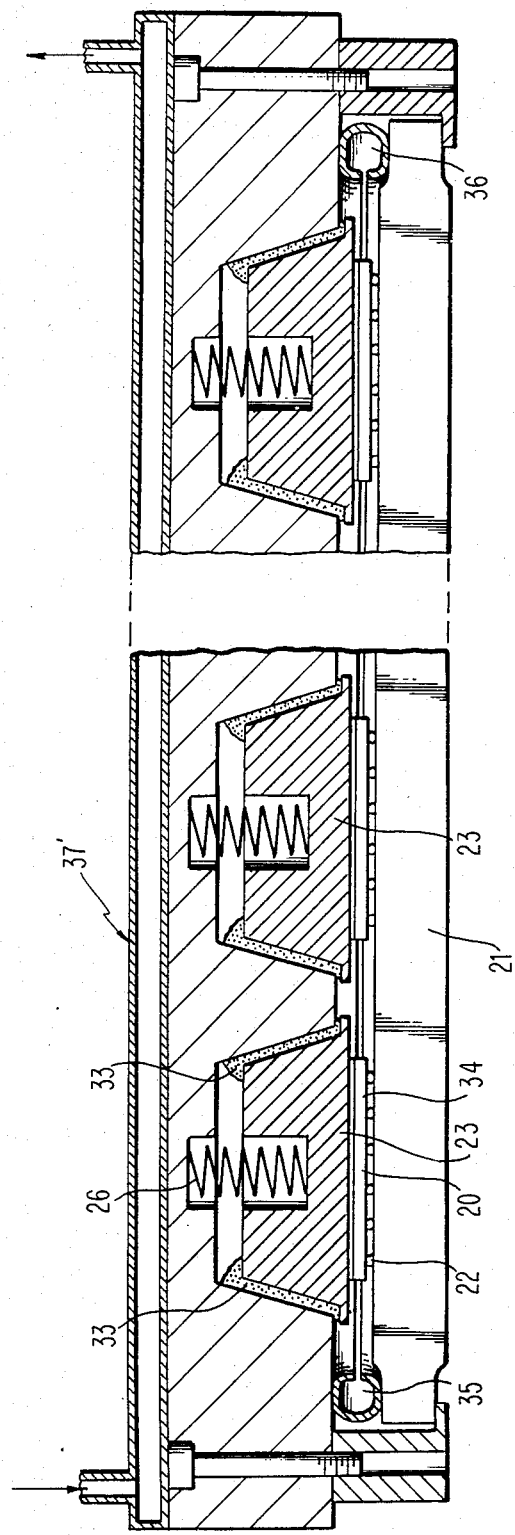
FIG. 7 is a cross-sectional representation of a multichip thermal conduction module having incorporated therein multiple thermal conduction discs and a hat having multiple tapered cavities for receiving the discs in accordance with the present invention.

While the invention has been discussed by focusing on a single disc-hat combination to cool a single chip it is easily extendable to cool a multiple number of chip by constructing a TCM utilizing the invention. One such multi-chip TCM constructed using the hat-disc, etc. combination shown in FIGS. 3-6 is illustrated in FIG. 7. In FIG. 7 elements designated by like numerals to those in FIGS. 3-6 correspond to like elements. 27' designates an unitary heat conductive cap member constructed by combining a plurality of hats 27 of FIGS. 3-6. The heat conductive cap member 27' is sealed at the edges 35 and 36 thereof by means of C-rings to the MLC substrate 21 in a manner anologous to that discussed in connection with the prior art TCM (FIG. 1). The cap 27' is provided with a plurality of cavities each having an outwardly tapered wall and in correspondence with a truncated conical disc which, in turn, is in thermal contact with an IC chip. Heat removal means 37' is thermally coupled to cap 27' for externally removing the heat generated by the chips from the cap 27'. Such a TCM easily meets the application requirements imposed on it by use of large-scale system processors which include temperature, humidity, power on/off, machine lifetime, failure rate, and various mechanical requirements. The TCM so designed, in addition to providing an efficient cooling path, ensures adequate mechanical and environmental protection of the IC chips.

Thus, there has been provided in accordance with the invention, an improved single or multiple chip thermal cooling apparatus that fully satisfies the objects and advantages set forth above.

While the invention has been described in conjunction with a specific preferred embodiment, it is evident that many alternatives, modifications and variations will be apparent to those skilled in the art in light of the foregoing description. For example, the thermal conduction disc can have a thimble shape with the inner lateral area addressing a protrusion from the hat. This would result in a much greater hat-grease interface area with attendant lower thermal resistance. It is therefore contemplated that the appended claims will embrace any such alternatives, modifications and variations as fall within the true scope and spirit of the invention.

What is claimed is:

1. An apparatus which cools a heat generating semiconductor integrated circuit chip comprising:
   a heat conductive truncated conical disc having flat base at one end and a conical portion at the opposite end, said opposite end constituting a truncated end, said base contacting the back surface of said chip;
   a heat conductive, thick-walled hat having a tapered inner surface essentially conforming to said disc;
   a spring member having upper and lower portions located between said hat and said disc forcing the disc against the chip and forming a narrow peripheral gap between the conical portion of said disc and said tapered surface of said hat; and
   conductive thermal grease filled in said peripheral gap providing a low interfacial thermal resistance between the disc and the hat.

2. The apparatus as in claim 1 wherein said conical portion of the disc has a surface area about 5 to 10 times the area of said chip.

3. The apparatus as recited in claim 1 further comprising a cavity in a central portion of the truncated end of said disc retaining therein said lower portion of said spring member.

4. The apparatus as recited in claim 3 further comprising said hat having a flat ceiling with a central cavity in correspondence with said cavity in said disc retaining therein said upper portion of said spring member.

5. An apparatus which removes heat from a heat generating element comprising:
   a thermally conductive truncated conical member having a flat base in thermal communication with said element via said base;
   a thermally conductive cap member having a flat top portion and a bottom portion having a cavity with a ceiling and a continuous tapered wall to mate substantially with said conical member;
   means interposed between said ceiling and said conical member therebeneath pressing said conical member against said element;
   a thermally conductive grease layer interposed between said conical member and the tapered wall of said cavity; and
   heat sink means associated with said flat top portion of the cap member.

6. The apparatus as in claim 5 further comprising a self-healing alloy layer between said element and flat base, said alloy having a low melting point and high thermal conductivity, to enhance transfer of heat from said element to said conical member.

7. A module which cools a plurality of heat generating semiconductor integrated circuit chips mounted face-down to a substrate, said module comprising:
   a plurality of heat conductive, truncated conical discs having a flat base, each in thermal contact with one of said chips via said base;
   a heat conductive module cap member sealed at the edges thereof to said substrate enclosing said plurality of chips, said cap member having therein a plurality of cavities, each in correspondence with one of said discs, said cavities each having a ceiling and a continuous outwardly tapered wall to mate with said disc in correspondence therewith;

a plurality of springs one compressed between each of said cavity ceilings and said corresponding disc to maintain said discs pressed against respective chips and also establish small peripheral gaps between the tapered wall of said cavities and the corresponding discs;

a thermal conductive grease filled in said peripheral gaps; and heat removal means thermally coupled to said cap member for externally removing the heat generated by said chips from said cap member.

8. The cooling module as recited in claim 7 further comprising a self-healing alloy interface formed between each of said chips and said base of said disc in correspondence with one of said chips, said alloy having a high thermal conductivity and low melting point, due to heat from said disc in correspondence with said one of said chips, being capable of melting and providing a low interfacial thermal resistance between said chips and discs.

9. The cooling module as recited in claim 7 wherein said disc are fabricated from a material selected from the group consisting of aluminum, copper, silver and silicon carbide.

10. The cooling module as recited in claim 7 wherein said module cap member is fabricated from a material selected from the group consisting of aluminum, copper, silver and silicon carbide.

11. An apparatus which removes heat from a heat-generating element comprising:
   a heat conductive truncated conical disc member having a flat base at one end and a conical portion at the opposite end, said base being in thermal contact with said element;
   a heat conductive thick-walled hat member having a tapered inner surface essentially conforming to said truncated conical disc member;
   means interposed between said hat member and said disc member forcing said disc member against said element; and
   a thermally conductive medium provided between said disc member and said tapered inner surface of said hat member
   whereby heat from said heat-generating element is thermally conducted to said hat member via said disc member and said conductive medium.

12. The apparatus as recited in claim 11 wherein said thermally conductive medium is thermal grease.

13. The apparatus as recited in claim 11 wherein said tapered surface is inclined with respect to said base at an angle having a range $85° \leq \theta < 90°$.

14. The apparatus as recited in claim 11 wherein said means is resilient means.

15. The apparatus as recited in claim 14 wherein said resilient means is a spring member.

* * * * *